United States Patent
Ando et al.

(10) Patent No.: US 11,335,730 B2
(45) Date of Patent: May 17, 2022

(54) VERTICAL RESISTIVE MEMORY DEVICE WITH EMBEDDED SELECTORS

(71) Applicant: International Business Machines Corporation, Armonk, NY (US)

(72) Inventors: Takashi Ando, Eastchester, NY (US); Praneet Adusumilli, Somerset, NJ (US); Reinaldo Vega, Mahopac, NY (US); Cheng Chi, Jersey City, NJ (US)

(73) Assignee: International Business Machines Corporation, Armonk, NY (US)

( * ) Notice: Subject to any disclaimer, the term of this patent is extended or adjusted under 35 U.S.C. 154(b) by 28 days.

(21) Appl. No.: 16/702,103

(22) Filed: Dec. 3, 2019

(65) Prior Publication Data

US 2021/0167128 A1     Jun. 3, 2021

(51) Int. Cl.
  *H01L 27/24*  (2006.01)
  *H01L 45/00*  (2006.01)

(52) U.S. Cl.
  CPC ........ *H01L 27/2418* (2013.01); *H01L 27/249* (2013.01); *H01L 45/1683* (2013.01)

(58) Field of Classification Search
  CPC  H01L 27/2481; H01L 27/249; H01L 27/2418
  See application file for complete search history.

(56) References Cited

U.S. PATENT DOCUMENTS

| | | | |
|---|---|---|---|
| 8,841,649 B2 * | 9/2014 | Pio | H01L 45/04 257/E45.001 |
| 8,988,918 B2 | 3/2015 | Franca-Neto | |
| 9,583,539 B2 | 2/2017 | Takaki | |
| 9,698,202 B2 | 7/2017 | Takaki | |
| 9,859,337 B2 | 1/2018 | Ratnam et al. | |
| 9,985,206 B1 | 5/2018 | Ando et al. | |
| 10,115,897 B1 * | 10/2018 | Sato | H01L 45/146 |
| 10,134,810 B2 * | 11/2018 | Ramaswamy | H01L 27/2418 |
| 10,157,653 B1 | 12/2018 | Li | |
| 10,186,554 B2 | 1/2019 | Toh et al. | |
| 10,270,029 B2 | 4/2019 | Ando et al. | |
| 10,290,680 B2 * | 5/2019 | Tanaka | H01L 45/1233 |
| 2017/0316824 A1 | 11/2017 | Bedau | |
| 2018/0047787 A1 | 2/2018 | Nakamura et al. | |
| 2018/0211703 A1 | 7/2018 | Choi et al. | |

FOREIGN PATENT DOCUMENTS

KR    10-1418051 B1    7/2014

OTHER PUBLICATIONS

Wong, H.-S., et al., "Metal-Oxide RRAM", Proceedings of the IEEE, Jun. 2012, pp. 1951-1970, vol. 100, No. 6.

(Continued)

*Primary Examiner* — Mark V Prenty
(74) *Attorney, Agent, or Firm* — Scully, Scott, Murphy & Presser, P.C.; Daniel P. Morris, Esq.

(57) ABSTRACT

A vertical resistive switching memory device is provided that includes a resistive random access memory (ReRAM) stack embedded in a material stack of alternating layers of an interlayer dielectric material and a recessed electrode material. A selector device encapsulates a portion of the ReRAM stack and is present in an undercut region that is laterally adjacent to each of the recessed electrode material layers of the material stack.

10 Claims, 5 Drawing Sheets

(56) References Cited

OTHER PUBLICATIONS

Baek, I. G., et al., "Realization of Vertical Resistive Memory (VRRAM) using cost effective 3D Process", 2011 International Electron Devices Meeting, Date of Conference: Dec. 5-7, 2011, pp. 31.8.1 to 31.8.4, Conference Location: Washington, DC, USA.
Chen, P.-Y., et al., "Impact of Vertical RRAM Device Characteristics on 3D Cross-point Array Design", 2014 IEEE 6th International Memory workshop (IMW), Date of Conference: May 18-21, 2014, 4 pages, Conference Location: Taipei, Taiwan.
Wang, Z., et al., "Memristors with diffusive dynamics as synaptic emulators for neuromorphic computing", Nature Materials, Jan. 2017, pp. 101-110, vol. 16.
Waser, R., "Redox-based Tera-bit memories", Electronic Materials Research Laboratory, 11 pages, first captured on May 5, 2019 http://web.archive.org/web/20190505061937/http://www.emrl.de/r_a_1.html.

\* cited by examiner

VERTICAL RESISTIVE MEMORY DEVICE WITH EMBEDDED SELECTORS

BACKGROUND

The present application relates to memory devices, and more particularly to a vertical resistive memory device and a method of forming the same.

Resistive random access memory (ReRAM) is considered as a promising technology for electronic synapse devices or memristors for neuromorphic computing as well as high-density and high-speed non-volatile memory applications. ReRAM is a type of non-volatile random access memory that works by changing the resistance across a dielectric solid-state material. The basic idea is that the dielectric solid-state material, which is normally insulating, can be made to conduct through a filament or conduction path formed after application of a sufficiently high voltage. The conduction path can arise from different mechanisms, including vacancy or metal defect migration. Once the filament is formed, it may be reset (broken, resulting in high resistance) or set (re-formed, resulting in lower resistance) by another voltage. Many current paths, rather than a single filament, are possibly involved.

In neuromorphic computing applications, a resistive memory device can be used as a connection (i.e., synapse) between a pre-neuron and a post-neuron, representing the connection weight in the form of device resistance. Multiple pre-neurons and post-neurons can be connected through a crossbar array of ReRAMs, which naturally expresses a fully connected neural network.

The density of a ReRAM can be increased by vertically stacking ReRAM stacks as practiced in Flash NAND technology, however, this approach is hampered by leakage paths through unselected devices (so called sneak paths). Typically, selector devices are required to shut off the sneak path. However, it is difficult to implement selector devices in 3D ReRAM configurations. There is thus a need to provide a 3D array of resistive switching memory devices in which selector devices are implemented therein to shut off the leakage paths through unselected devices.

SUMMARY

In one aspect of the present application, a vertical resistive switching memory device is provided. In one embodiment, the vertical resistive switching memory device includes a resistive random access memory (ReRAM) stack embedded in a material stack of alternating layers of an interlayer dielectric material and a recessed electrode material. A selector device encapsulates a portion of the ReRAM stack and is present in an undercut region that is laterally adjacent to each of the recessed electrode material layers of the material stack.

In another aspect of the present application, a method of forming a vertical resistive switching memory device is provided. In one embodiment, the method includes forming a material stack of alternating layers of an interlayer dielectric material and an electrode material on a surface of a substrate, wherein a via opening is present in the material stack that physically exposes a surface of the substrate. Each of the electrode material layers of the material stack is then laterally recessed to provide recessed electrode material layers, wherein an undercut region is formed laterally adjacent to each recessed electrode material layer. Next, a selector device is formed in each undercut region, and thereafter a ReRAM stack is formed in the via opening.

DETAILED DESCRIPTION

Figure 1:
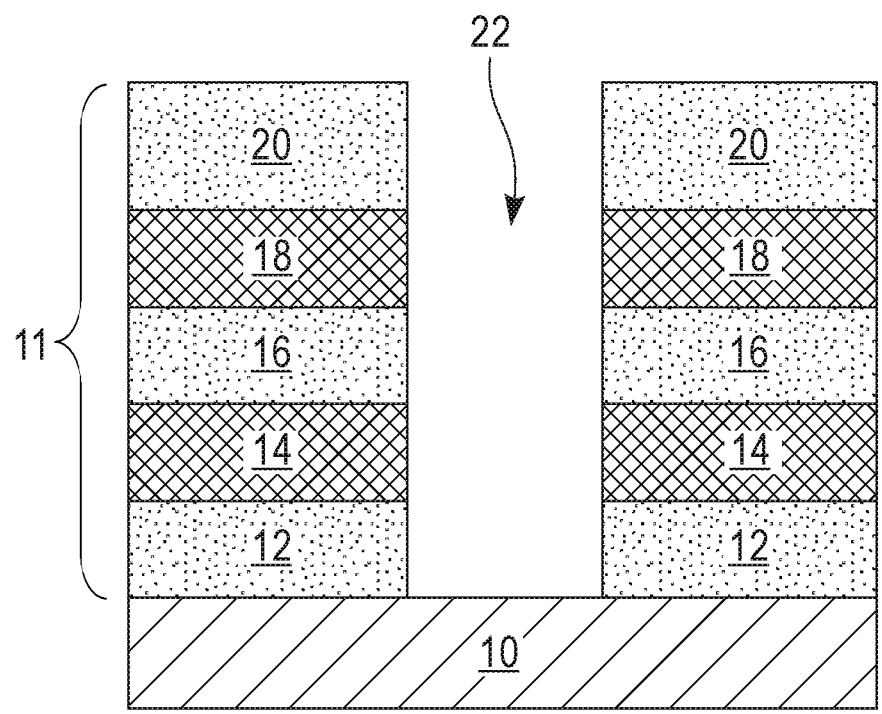
FIG. 1 is a cross sectional view of an exemplary structure that can be used in accordance with an embodiment of the present application, the exemplary structure includes a material stack of alternating layers of an interlayer dielectric material and an electrode material located on a substrate, wherein a via opening is present in the material stack that physically exposes a surface of the substrate.

The present application will now be described in greater detail by referring to the following discussion and drawings that accompany the present application. It is noted that the drawings of the present application are provided for illustrative purposes only and, as such, the drawings are not drawn to scale. It is also noted that like and corresponding elements are referred to by like reference numerals.

In the following description, numerous specific details are set forth, such as particular structures, components, materials, dimensions, processing steps and techniques, in order to provide an understanding of the various embodiments of the present application. However, it will be appreciated by one of ordinary skill in the art that the various embodiments of the present application may be practiced without these specific details. In other instances, well-known structures or processing steps have not been described in detail in order to avoid obscuring the present application.

It will be understood that when an element as a layer, region or substrate is referred to as being "on" or "over" another element, it can be directly on the other element or intervening elements may also be present. In contrast, when an element is referred to as being "directly on" or "directly over" another element, there are no intervening elements present. It will also be understood that when an element is referred to as being "beneath" or "under" another element, it can be directly beneath or under the other element, or intervening elements may be present. In contrast, when an element is referred to as being "directly beneath" or "directly under" another element, there are no intervening elements present.

In order to circumvent leakage paths through unselected devices of a 3D array of resistive switching devices, a vertical resistive memory device is provided that contains at least one embedded selector device that encapsulates a portion of a ReRAM stack that is present in a via opening of a material stack of alternating layers of interlayer dielectric material and electrode material. The embedded selector device is present in an undercut region that is formed by recessing each electrode material layer of the material stack. The vertical resistive memory device of the present application provides isolation between adjacent selector devices and enables individual selection of ReRAM devices without area penalty.

Reference is first made to FIG. 1, which illustrates an exemplary structure that can be used in accordance with an embodiment of the present application. The exemplary structure illustrated in FIG. 1 includes a material stack 11 of alternating layers of an interlayer dielectric material (e.g., interlayer dielectric material layers 12, 16, 20) and an electrode material (i.e., electrode material layers 14, 18) located on a substrate 10. The exemplary structure of FIG. 1 also includes a via opening 22 that is present in the material stack 11 that physically exposes a surface of the substrate 10. Although the present application describes and illustrates a single via opening 22, the present application works equally well for embodiments in which a plurality of via openings 22 is formed into the material stack 11.

In some embodiments of the present application, substrate 10 is a front-end-of-the-line (FEOL) level that includes one or more semiconductor devices formed on a surface of a semiconductor substrate. The one or more semiconductor devices can include, but are not limited to, transistors, resistors, and/or diodes. The FEOL level can be formed utilizing techniques that are well known to those skilled in the art.

In other embodiments of the present application, substrate 10 is a lower back-end-of-the (BEOL) level that includes one or more electrically conductive structures that are embedded in one or more interconnect dielectric materials. In such an embodiment, a FEOL level is typically located beneath the lower interconnect level.

The material stack 11, which is present on substrate 10, is formed in the BEOL. As mentioned above, the material stack 11 is composed of alternating layers of an interlayer dielectric material (e.g., interlayer dielectric material layers 12, 16, 20) and an electrode material (i.e., electrode material layers 14, 18). In the present application, the number of electrode material layers and interlayer dielectric material layers of the material stack 11 can vary so long as each electrode material layer is sandwiched between a bottom interlayer dielectric material layer and a top interlayer dielectric material layer. Thus, material stack 11 includes 'n' electrode material layers and n+1 interlayer dielectric material layers, wherein n is an integer that is greater than 1 (i.e., 2, 3, 4, etc.). In the illustrated embodiment, n is 2 thus material stack 11 includes two electrode material layers (14, 18) and three interlayer dielectric material layers (12, 16, 20).

Each interlayer dielectric material layer (e.g., interlayer dielectric material layers 12, 16, 20) can be composed of a dielectric material such as, for example, silicon dioxide, silicon nitride, undoped silicate glass (USG), fluorosilicate glass (FSG), borophosphosilicate glass (BPSG), a spin-on low-k dielectric layer, a chemical vapor deposition (CVD) low-k dielectric layer or any combination thereof. The term "low-k" as used throughout the present application denotes a dielectric material that has a dielectric constant of less than 4.0; all dielectric constants are measured under vacuum unless otherwise stated herein). In another embodiment, a self-planarizing material such as a spin-on glass (SOG) or a spin-on low-k dielectric material such as SiLK™ can be used as the dielectric material for the interlayer dielectric material layers of material stack 11.

In some embodiments, each interlayer dielectric material layer (e.g., interlayer dielectric material layers 12, 16, 20) of material stack 11 can be composed of a compositionally same dielectric material. In other embodiments, at least one of the interlayer dielectric material layers of material stack 11 is composed of a dielectric material that is compositionally different from another of the interlayer dielectric material layers of material stack 11.

Each interlayer dielectric material layer (e.g., interlayer dielectric material layers 12, 16, 20) can be formed utilizing a deposition process including, for example, chemical vapor deposition (CVD), plasma enhanced chemical vapor deposition (PECVD), evaporation or spin-on coating. Each interlayer dielectric material layer (e.g., interlayer dielectric material layers 12, 16, 20) can have a thickness from 10 nm to 100 nm. In some embodiments, each interlayer dielectric material layer (e.g., interlayer dielectric material layers 12, 16, 20) of material stack 11 has a same thickness. In other embodiments, at least one of the interlayer dielectric material layers of material stack 11 has a different thickness than a thickness of another of the interlayer dielectric material layers of material stack 11.

Each electrode material layer (e.g., electrode material layers 14, 18) of material stack 11 will subsequently serve as a bottom electrode of a selected memory device; the bottom electrodes are spaced apart and each bottom electrode is oriented in a horizontal direction. Each electrode material layer (e.g., electrode material layers 14, 18) is composed of first electrode material such as, for example, titanium nitride (TiN), tantalum nitride (TaN), tungsten (W) or tungsten nitride (WN). The first electrode material is an inert electrode material. By "inert electrode material" it is meant, an electrode material that does not chemically react with a metal oxide layer in an ReRAM stack. Each electrode material layer (e.g., electrode material layers 14, 18) of material stack 11 is typically composed of a compositionally same first electrode material. In some embodiments, at least one of electrode material layers of the material stack is compositionally different from another of electrode material layers of material stack 11.

Each electrode material layer (e.g., electrode material layers 14, 18) can be formed utilizing a deposition process including, for example, CVD, PECVD, atomic layer deposition (ALD), sputtering or plating. Each electrode material layer (e.g., electrode material layers 14, 18) can have a thickness from 10 nm to 50 nm. In some embodiments, each electrode material layer (e.g., electrode material layers 14, 18) of material stack 11 has a same thickness. In other embodiments, at least one of the electrode material layers of material stack 11 has a different thickness than a thickness of another of the electrode material layers of material stack 11.

Via opening 22 is a three-dimensional feature that is formed into material stack 11 utilizing a patterning process.

In one embodiment, the patterning process used in forming the via opening 22 into the material stack 11 includes lithography and etching. Lithography includes forming a photoresist material over a material or material stack that needs to be patterned, exposing the photoresist material to a pattern of irradiation, and developing the exposed photoresist material. The etch used in forming the via opening 12 can include an anisotropic etching process such as, for example, a reactive ion etch. A single etching process or multiple etching processes can be used in forming via opening 22 into the material stack 11. In other embodiments, a sidewall image transfer process can be used to form via opening 22 into the material stack 11.

Notwithstanding the technique used in forming the via opening 22, the via opening 22 typically has a critical dimension (CD) from 50 nm to 200 nm. The via opening 22 is typically cylindrical in shape. Other asymmetric shapes besides cylindrical are possible and can be used in the present application as the shape of via opening 22. The via opening 22 is encircled by the material stack 11.

Figure 2:
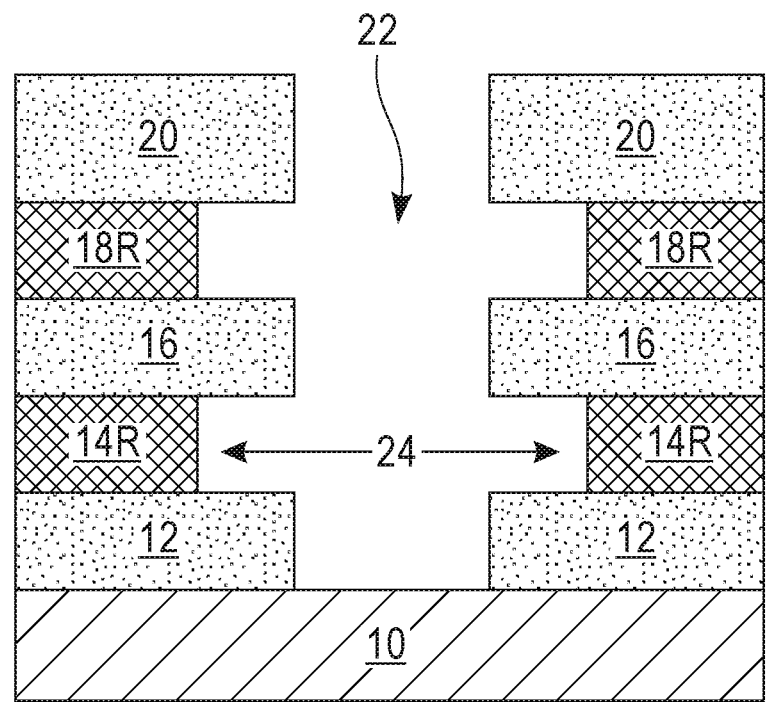
FIG. 2 is a cross sectional view of the exemplary structure of FIG. 1 after laterally recessing each of the electrode material layers of the material stack to provide recessed electrode layers, and to form an undercut region laterally adjacent to each recessed electrode material layer.

Referring now to FIG. 2, there is illustrated the exemplary structure of FIG. 1 after laterally recessing each of the electrode material layers (e.g., electrode material layers 14, 18) of the material stack 11 to provide recessed electrode layers (e.g., recessed electrode material layers 14R, 18R), and to form an undercut region 24 laterally adjacent to each recessed electrode material layer (e.g., recessed electrode material layers 14R, 18R).

The lateral recessing of each of the electrode material layers (e.g., electrode material layers 14, 18) of the material stack 11 includes an isotropic etching process such as, for example, a reactive ion etching process or a wet etching process. In some embodiments, a combination of isotropic etching processes, e.g., reactive ion etching and a wet etching process, can be employed.

Each recessed electrode material layer (e.g., recessed electrode material layers 14R, 18R) has a width that is less than a width of each of the interlayer dielectric material layers (e.g., interlayer dielectric material layers 12, 16, 20). Each undercut region 24 is laterally adjacent to a recessed electrode material layer and is in contact with the via opening 22. Each undercut region 24 physically exposes a vertical sidewall of one of the recessed electrode material layers. Each undercut region 24 is located between an overhanging portion of a top interlayer dielectric material layer of material stack 11, and an under-hanging portion of a bottom interlayer dielectric material layer.

Figure 3:
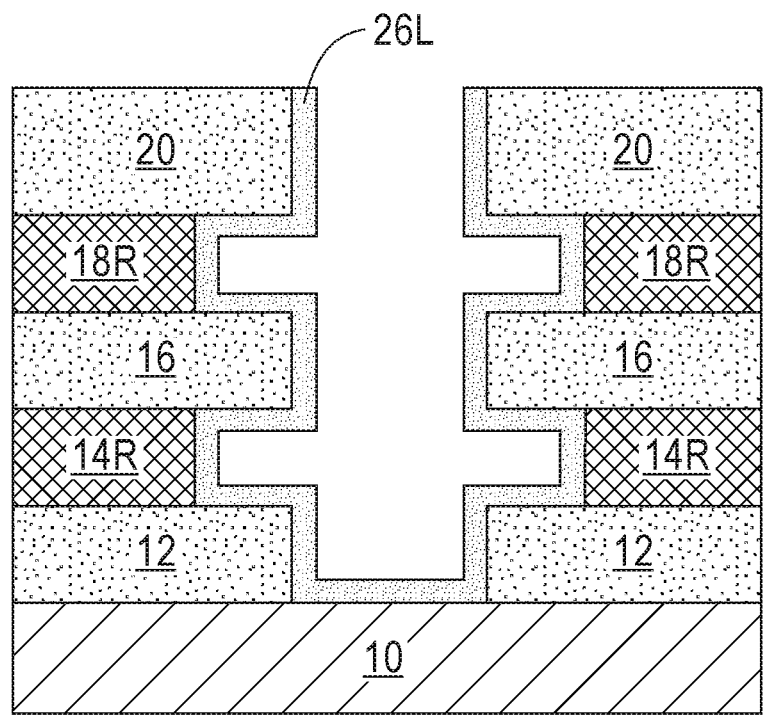
FIG. 3 is a cross sectional view of the exemplary structure of FIG. 2 after forming a selector dielectric layer in the via opening and each undercut region.

Referring now to FIG. 3, there is illustrated the exemplary structure of FIG. 2 after forming a selector dielectric layer 26L in the via opening 22 and each undercut region 24. Although not shown, a portion of the selector dielectric layer 26L can extend outside the via opening 22 and by formed on a topmost surface of the material stack 11.

The selector dielectric layer 26L is composed of any selector dielectric material such as, for example, silicon dioxide or silicon oxynitride. The selector dielectric material that provides the selector dielectric layer 26L will subsequently serve as a switching medium of a selector device. The selector dielectric layer 26L is typically compositionally different from the interlayer dielectric material that provides each of the interlayer dielectric material layers (e.g., interlayer dielectric material layers 12, 16, 20) of material stack 11. The selector dielectric layer 26L can be formed by CVD, PECVD or ALD. The selector dielectric layer 26L is typically a conformal layer. By "conformal layer" it is meant that the thickness of the layer is substantially the same (i.e., ±10%) on all surfaces, or that the variation is less than 15% of the nominal thickness. In one embodiment, the selector dielectric layer 26L has a thickness from 3 nm to 10 nm.

Within each undercut region 24, the selector dielectric layer 26L is formed along the vertical sidewall of the physically exposed portion of each recessed electrode material layer (e.g., recessed electrode material layers 14R, 18R), along the overhanging portion of the top interlayer dielectric material layer of material stack 11, and along the under-hanging portion of a bottom interlayer dielectric material layer. The selector dielectric layer 26L does not completely fill in each of the undercut regions 24. Within the via opening 22, the selector dielectric layer 26L is formed along the sidewall of the via opening 22 and along the bottom wall of the via opening 22.

Figure 4:
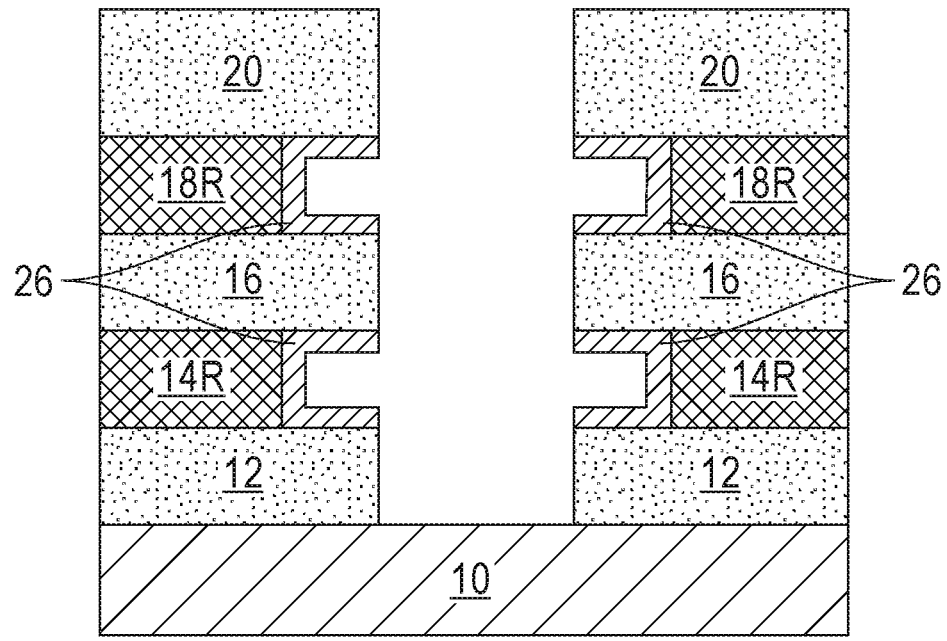
FIG. 4 is a cross sectional view of the exemplary structure of FIG. 3 after performing an etch back process to remove the selector dielectric layer in the via opening, while maintaining the selector dielectric layer in each undercut region.

Referring now to FIG. 4, there is illustrated the exemplary structure of FIG. 3 after performing an etch back process to remove the selector dielectric layer 26L in the via opening 22, while maintaining the selector dielectric layer 26L in each undercut region 24. In one embodiment, the etch back process used to remove the selector dielectric layer 26L from the via opening 22 includes an anisotropic oxide reactive ion etch.

The maintained selector dielectric layer 26L that is present in each undercut region 24 can be referred to as a selector dielectric liner 26. Within each undercut region 24, the selector dielectric liner 26 is present along the vertical sidewall of a recessed electrode material layer (e.g., recessed electrode material layers 14R, 18R), along the overhanging portion of the top interlayer dielectric material layer of material stack 11, and along the under-hanging portion of a bottom interlayer dielectric material layer. The selector dielectric liner 26 does not completely fill in each of the undercut regions 24, and no selector dielectric liner 26 is present in the via opening 22.

As is illustrated in FIG. 4, each selector dielectric liner 26 is C shaped and includes a vertical portion, a top horizontal portion that extends in a first direction from an upper portion of the vertical portion, and a bottom horizontal portion that extends in the first direction from a lower portion of the vertical portion.

Figure 5:
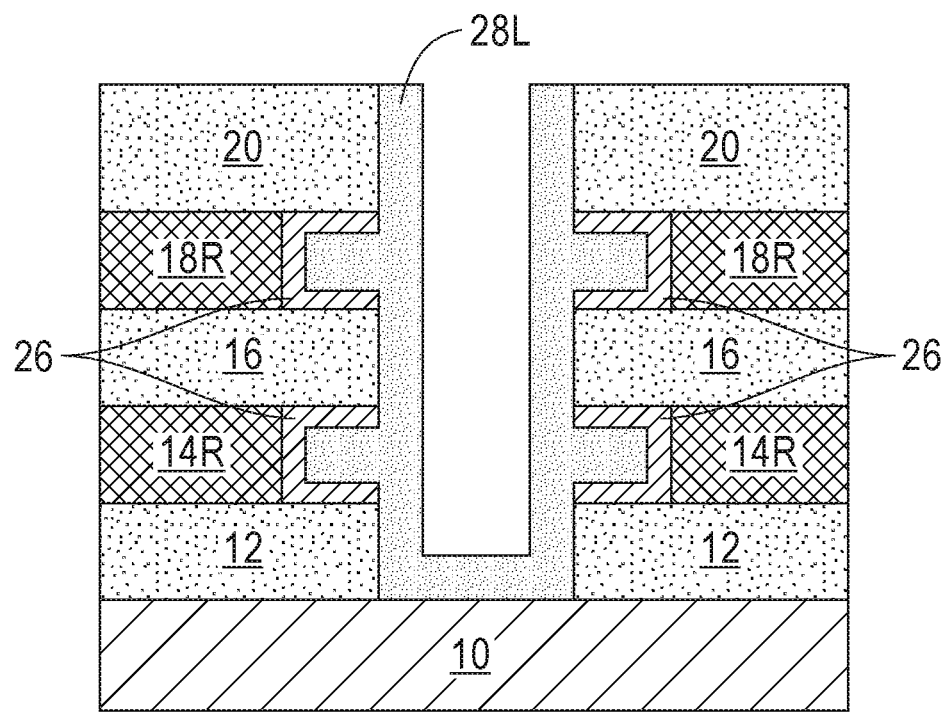
FIG. 5 is a cross sectional view of the exemplary structure of FIG. 4 after forming a metal source material layer in the via opening and each undercut region.

Referring now to FIG. 5, there is illustrated the exemplary structure of FIG. 4 after forming a metal source material layer 28L in the via opening 22 and each undercut region 24. Although not shown, a portion of the metal source material layer 28L can extend outside the via opening 22 and by formed on a topmost surface of the material stack 11.

The metal source material layer 28L can be composed of copper or silver. Other metals can be used as long as the selected metal can be used as a cation source material of a selector device. The metal source material layer 28L can be formed utilizing a deposition process such as, for example, CVD or PECVD. The metal source material layer 28L is formed into a remaining volume of each undercut region 24 and contacts the selector dielectric liner 26 that is present in the undercut region 24.

Figure 6:
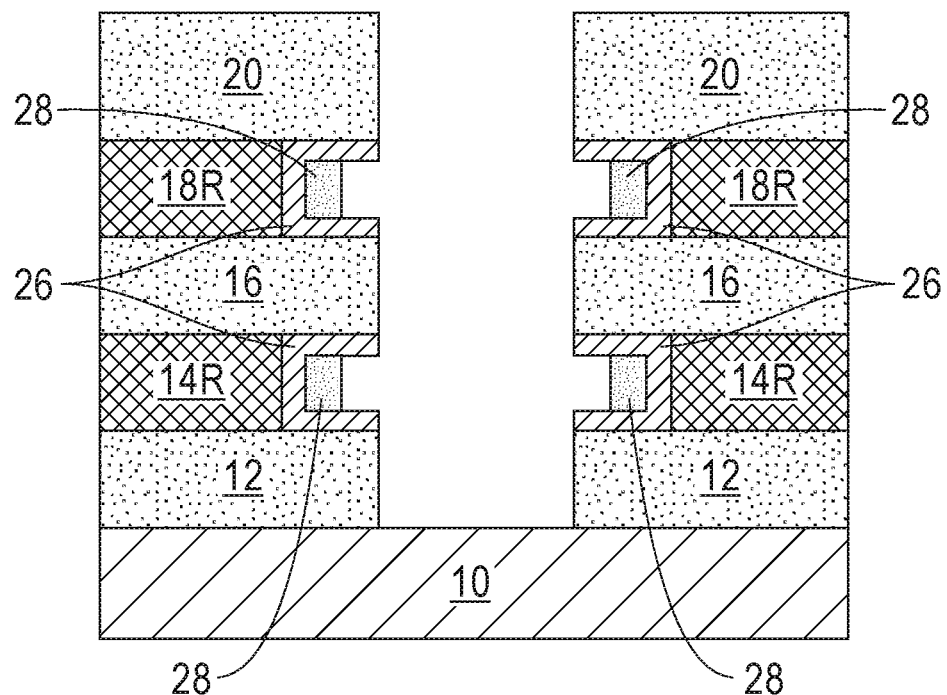
FIG. 6 is a cross sectional view of the exemplary structure of FIG. 5 after performing an etch back process to remove the metal source material layer in the via opening, while maintaining the metal source material layer in each undercut region.

Referring now to FIG. 6, there is illustrated the exemplary structure of FIG. 5 after performing an etch back process to remove the metal source material layer 28L in the via opening 22, while maintaining the metal source material layer 28L in each undercut region 24. In one embodiment, the etch back process used to remove the metal source material layer 28L that is present in the via opening 22 includes an isotropic reactive ion etch. In another embodiment, the etch back process used to remove the metal source material layer 28L that is present in the via opening 22 includes a wet etching process.

The maintained metal source material layer 28L that is present in each undercut region 24 can be referred to as a metal source material 28. Within each undercut region 24, the metal source material 28 is present along the vertical portion of the selector dielectric liner 26, along a first portion of the top horizontal portion of the selector dielectric liner 26, and along a first portion of the bottom horizontal portion of the selector dielectric liner 26. The metal source material 28 does not completely fill in each of the undercut regions 24, and no metal source material 28 is present in the via opening 22.

Figure 7:
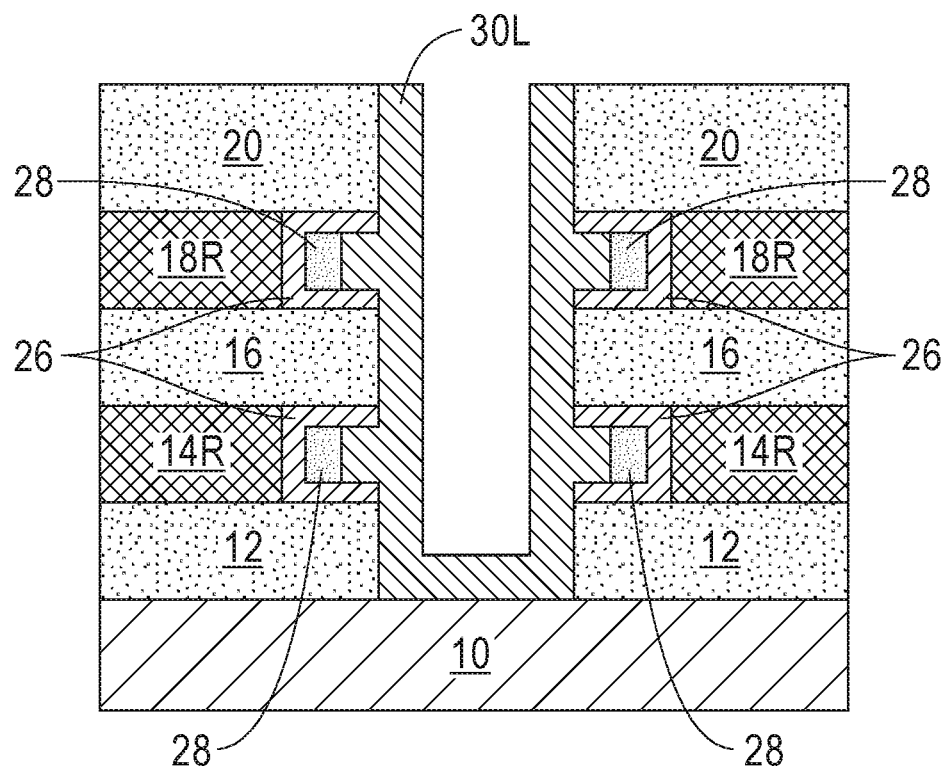
FIG. 7 is a cross sectional view of the exemplary structure of FIG. 6 after forming a diffusion barrier layer in the via opening and each undercut region.

Referring now to FIG. 7, there is illustrated the exemplary structure of FIG. 6 after forming a diffusion barrier layer 30L in the via opening 22 and each undercut region 24. Although not shown, a portion of the diffusion barrier layer 30L can extend outside the via opening 22 and by formed on a topmost surface of the material stack 11.

The diffusion barrier layer 30L is composed of a diffusion barrier material (i.e., a material that serves as a barrier to prevent a conductive material such as copper from diffusing there through). Examples of diffusion barrier materials that can be used in providing the diffusion barrier layer 30L include, but are not limited to, Ta, TaN, Ti, TiN, Ru, RuN, RuTa, RuTaN, W, or WN. In some embodiments, the diffusion barrier layer 30L can include a material stack of diffusion barrier materials. In one example, the diffusion barrier layer 30L can be composed of a stack of Ta/TaN. The diffusion barrier material can be formed by a deposition process including, for example, CVD, PECVD, ALD, PVD, sputtering, chemical solution deposition or plating.

The diffusion barrier layer 30L is formed into a remaining volume of each undercut region 24. Within each undercut region 24, the diffusion barrier layer 30L contacts a vertical sidewall of the metal source material 28, contacts a second portion of the top horizontal portion of the selector dielectric liner 26, and contacts a second portion of the bottom horizontal portion of the selector dielectric liner 26.

Figure 8:
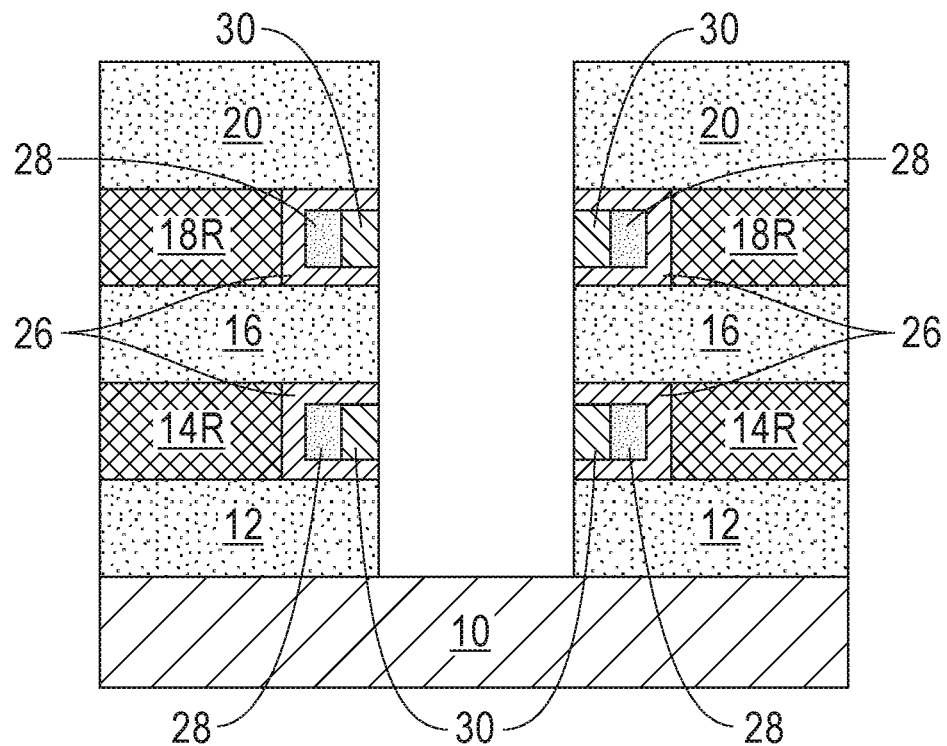
FIG. 8 is a cross sectional view of the exemplary structure of FIG. 7 after performing an etch back process to remove the diffusion barrier layer in the via opening, while maintaining the diffusion barrier layer in each undercut region.

Referring now to FIG. 8, there is illustrated the exemplary structure of FIG. 7 after performing an etch back process to remove the diffusion barrier layer 30L in the via opening 22, while maintaining the diffusion barrier layer 30L in each undercut region 24. In one embodiment, the etch back process used to remove the diffusion barrier layer 30L that is present in the via opening 22 includes an anisotropic reactive ion etch. In another embodiment, the etch back process used to remove the diffusion barrier layer 30L that is present in the via opening 22 includes a wet etching process.

The maintained diffusion barrier layer 30L that is present in each undercut region 24 can be referred to as a diffusion barrier material 30. Within each undercut region 24, the diffusion barrier material 30 is present along the vertical sidewall of the metal source material 28, along the second portion of the top horizontal portion of the selector dielectric liner 26, and along the second portion of the bottom horizontal portion of the selector dielectric liner 26. The diffusion barrier material 30 fills in the remaining volume of the undercut regions 24, and no diffusion barrier material 30 is present in the via opening 22. As is shown, the selector dielectric liner 26 has sidewalls that are adjacent to the via opening that are vertically aligned with a vertical sidewall of the diffusion barrier material 30 that is also adjacent to the via opening 22.

Collectively, the selector dielectric liner 26, the metal source material 28, and the diffusion barrier material 30 that are present in each undercut region 24 define a selector device of the present application. Each selective device (26, 28, 30) encapsulates a portion of the via opening 22. Also, each selective device (26, 28, 30) is located between one of the recessed electrode material layers of the material stack 11 and the via opening 22.

Figure 9:
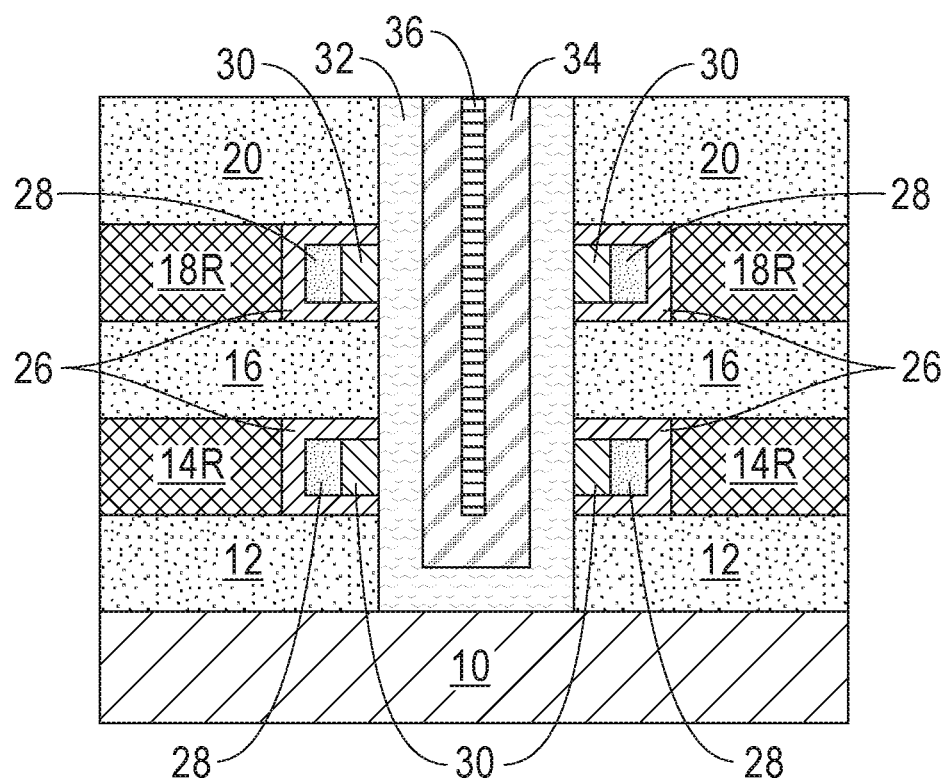
FIG. 9 is a cross sectional view of the exemplary structure of FIG. 8 after forming a ReRAM stack in the via opening.

Referring now to FIG. 9, there is illustrated the exemplary structure of FIG. 8 after forming a ReRAM stack in the via opening 22. The ReRAM stack is vertically oriented, while the recessed electrode material layers are horizontally oriented. In some embodiments, the ReRAM stack includes a dielectric switching material 32 and a reactive electrode 34. The dielectric switching material 32 and the reactive electrode 34 of the ReRAM stack are both U-shaped. The term "U shaped" is used in the present application to define a structure that includes a bottom horizontal portion and a vertical portion that extends upward from each end of the bottom horizontal portion. Accordingly, the dielectric switching material 32, and the reactive electrode 34 have topmost surfaces that are coplanar with each other.

The dielectric switching material 32 (which may also be referred to as a filament forming material) of the ReRAM stack is composed of a dielectric material such as a dielectric metal oxide that has a dielectric constant of greater than 4.0. The dielectric switching material 32 is electrically insulating but can be converted into a filament that is electrically conducting during application of a high voltage. The filament can be reset and set numerous times using various applied voltages. Examples of dielectric metal oxides that can be employed as the dielectric switching material 32 include, but are not limited to, hafnium oxide ($HfO_x$), tantalum oxide ($TaO_x$), titanium oxide ($TiO_x$), aluminum oxide ($AlO_x$), or combinations thereof. The dielectric switching material 32 can be formed utilizing a deposition process such as, for example, CVD, PECVD, ALD, chemical solution deposition or evaporation. The dielectric switching material can have a thickness from 1 nm to 50 nm; other thicknesses however are contemplated can be used as the thickness of the dielectric switching material 32.

The reactive electrode 34 of the ReRAM stack is composed of an oxygen deficient conductive material such as, for example, Ti-rich TiN or a (M)AlC containing stack, wherein M is a transition metal selected from the group consisting of titanium (Ti), tantalum (Ta) and niobium (Nb). By Ti-rich it is meant a TiN alloy that includes greater than 50 atomic % of Ti. The reactive electrode 34, which forms a top electrode of the memory device of the present application, can have a thickness from 2 nm to 80 nm; other thicknesses are possible and can be used in the present application as the thickness of the reactive electrode 34. The reactive electrode 34 can be formed by a deposition process such as, for example, sputtering, electroplating, electroless plating, ALD, CVD, PECVD or PVD.

In some embodiments, and following deposition of a layer of a dielectric switching material and a layer of a reactive electrode, a planarization process (such as, for example, chemical mechanical polishing) can be used to provide a ReRAM stack (32, 34) having a topmost surface that is coplanar with a topmost surface of the topmost interlayer dielectric material layer of material stack 11.

In some embodiments, the ReRAM stack further includes a metal fill material 36. In such an embodiment, the reactive electrode 34 is present entirely between the metal fill material 36 and the dielectric switching material 32. The metal fill material 36, which is compositionally different from the reactive electrode 34, includes an electrically conductive metal such as, for example, copper, aluminum or tungsten. The metal fill material 36 can be formed by a deposition process such as, for example, sputtering, electroplating, electroless plating, ALD, CVD, PECVD or PVD. In some embodiments, and following deposition of a layer of a dielectric switching material, a layer of a reactive electrode, and a layer of metal fill material, a planarization process (such as, for example, chemical mechanical polishing) can be used to provide a ReRAM stack (32, 34, 36) having a topmost surface that is coplanar with a topmost surface of the topmost interlayer dielectric material layer of material stack 11.

Notably, FIG. 9 illustrates an exemplary vertical resistive switching memory device in accordance with an embodiment of the present application. The exemplary vertical resistive switching memory device of FIG. 9 includes a resistive random access memory (ReRAM) stack (32, 34) embedded in a material stack 11 of alternating layers of an interlayer dielectric material (e.g., interlayer dielectric material layers 12, 16, 20) and a recessed electrode material (e.g., recessed electrode material layers 14R, 18R). A selector device (26, 28, 30) encapsulates a portion of the ReRAM stack (32, 34) and is present in an undercut region 24 that is laterally adjacent to each of the recessed electrode material layers (e.g., recessed electrode material layers 14R, 18R) of the material stack 11.

The selector dielectric liner 26 is C-shaped and has a vertical portion that contacts a vertical sidewall of the recessed electrode material layer (14R, 18R), an upper horizontal portion that contacts a topmost surface of both the metal source material 28 and the diffusion barrier material 30, and a bottom horizontal portion that contacts a bottommost surface of both the metal source material 28 and the diffusion barrier material 30. In the present application, a first vertical sidewall of the diffusion barrier material 30 contacts a vertical sidewall of the metal source material 28, and a second vertical sidewall of the diffusion barrier material 30, that is opposite the first vertical sidewall of the diffusion barrier material 30 contacts a portion of the dielectric switching material 32 of the ReRAM stack (32, 34).

The vertical resistive switching memory device illustrated in FIG. 9 contains embedded selector devices (26, 28, 30) that prevents leakage paths through unselected devices. The vertical resistive switching memory devices (26, 28, 30) illustrated in FIG. 9 provide isolation between adjacent selector devices and enables individual selection of ReRAM devices without area penalty.

While the present application has been particularly shown and described with respect to preferred embodiments thereof, it will be understood by those skilled in the art that the foregoing and other changes in forms and details may be made without departing from the spirit and scope of the present application. It is therefore intended that the present application not be limited to the exact forms and details described and illustrated, but fall within the scope of the appended claims.

What is claimed is:

1. A vertical resistive memory device comprising:
a resistive random access memory (ReRAM) stack embedded in a material stack of alternating layers of an interlayer dielectric material and a recessed electrode material, wherein a topmost surface of the ReRAM stack is coplanar with a topmost surface of a topmost interlayer dielectric material layer of the material stack; and
a selector device encapsulating a portion of the ReRAM stack and present entirely in an undercut region that is laterally adjacent to each of the recessed electrode material layers of the material stack, wherein each of the recessed electrode material layers of the material stack encircles a portion of the ReRAM stack, the ReRAM stack comprises a U-shaped dielectric switching material and a U-shaped reactive electrode, and the selector device comprises a selector dielectric liner, a metal source material, and a diffusion barrier material.

2. A vertical resistive memory device comprising:
a resistive random access memory (ReRAM) stack embedded in a material stack of alternating layers of an interlayer dielectric material and a recessed electrode material, wherein the ReRAM stack comprises a U-shaped dielectric switching material and a U-shaped reactive electrode; and
a selector device encapsulating a portion of the ReRAM stack and present entirely in an undercut region that is laterally adjacent to each of the recessed electrode material layers of the material stack, wherein the selector device comprises a selector dielectric liner, a metal source material, and a diffusion barrier material.

3. A vertical resistive memory device comprising:
a resistive random access memory (ReRAM) stack embedded in a material stack of alternating layers of an interlayer dielectric material and a recessed electrode material; and
a selector device encapsulating a portion of the ReRAM stack and present entirely in an undercut region that is laterally adjacent to each of the recessed electrode material layers of the material stack, wherein a topmost surface of the ReRAM stack is coplanar with a topmost surface of a topmost interlayer dielectric material layer of the material stack, the ReRAM stack comprises a U-shaped dielectric switching material and a U-shaped reactive electrode, and the selector device comprises a selector dielectric liner, a metal source material, and a diffusion barrier material.

4. The vertical resistive memory device of claim 1, wherein the ReRAM stack further comprises a metal fill material, wherein the reactive electrode is present entirely between the metal fill material and the dielectric switching material.

5. The vertical resistive memory device of claim 1, wherein the selector dielectric liner is C-shaped and has a vertical portion that contacts a vertical sidewall of the recessed electrode material layer, an upper horizontal portion that contacts a topmost surface of both the metal source material and the diffusion barrier material, and a bottom horizontal portion that contacts a bottommost surface of both the metal source material and the diffusion barrier material.

6. The vertical resistive memory device of claim 5, wherein a first vertical sidewall of the diffusion barrier material contacts a vertical sidewall of the metal source material, and a second vertical sidewall of the diffusion barrier material, that is opposite the first vertical sidewall of the diffusion barrier material, contacts a portion of the dielectric switching material.

7. The vertical resistive memory device of claim 1, wherein each of the recessed electrode material layers of the material stack is sandwiched between a bottom interlayer dielectric material layer and a top interlayer dielectric material layer.

8. The vertical resistive memory device of claim 1, wherein each of the interlayer dielectric material layers of the material stack has a width that is greater than a width of each of the recessed electrode material layers of the material stack.

9. The vertical resistive memory device of claim 2, wherein each of the recessed electrode material layers of the material stack encircles a portion of the ReRAM stack.

10. The vertical resistive memory device of claim 1, wherein the metal source material is composed of copper or silver.

\* \* \* \* \*